United States Patent

[11] 3,581,221

[72] Inventor Edward J. Martin, Jr.
219 Ferguson Ave., Newport News, Va. 23601

[21] Appl. No. 724,974
[22] Filed Apr. 29, 1968
[45] Patented May 25, 1971

[54] FLEXIBLE AMPLIFICATION SYSTEM
10 Claims, 4 Drawing Figs.

[52] U.S. Cl. .......... 330/24, 330/308, 330/35, 330/3, 330/20, 330/38M
[51] Int. Cl. .......... H03f 3/16, H03f 3/18
[50] Field of Search .......... 330/38 M, 3, 66, 35, 30 D

[56] References Cited

UNITED STATES PATENTS 3,434,068 3/1969 Serin .......... 330/38X
3,447,093 5/1969 Uzunoglu .......... 330/38X
3,466,564 9/1969 Weischedel .......... 330/66

OTHER REFERENCES

Electronic Design — pp. 82— 84 Vol. 13 No. 4 Feb. 15, 1965 " Unanswered Questions on Integrated Circuits". 330—38M

*Primary Examiner*—Nathan Kaufman
*Attorney*—Cushman, Darby and Cushman

ABSTRACT: A flexible and expandable system comprising a number of modules from which a composite power amplifier of any given output capability can be constructed. An operational amplifier can be constructed from a driver module performing the voltage gain function and a number of booster modules connected to it furnishing the output power capability.

INVENTOR
EDWARD J. MARTIN, Jr.

BY Cushman, Darby & Cushman
ATTORNEYS

INVENTOR
EDWARD J. MARTIN, Jr.

BY Cushman, Darby & Cushman
ATTORNEYS

FLEXIBLE AMPLIFICATION SYSTEM

BRIEF DESCRIPTION OF THE PRIOR ART AND SUMMARY OF THE INVENTION

This invention relates to a flexible and expandable power amplification system which is comprised of a number of separate and distinct amplifier modules from which, by properly interconnecting a number of modules, a composite power amplifier of any given power capability can be assembled which can be expanded almost indefinitely in output current and, hence, power capability.

More particularly, the invention relates to a system of modules which can be used as building block units and which with the proper mutual compatibility can be used to construct composite power amplifiers whose specific output current and power capability can be selected over a very wide range simply by specifying the number and type of output modules and which can be provided from a minimum number of dissimilar module types and accomplished with a minimum of electronic and mechanical design and engineering.

An electronic amplifier is an electronic circuit which draws on a source of electrical energy to increase the voltage or current magnitude of electrical input signals, furnishing a more powerful output signal which is then utilized to perform some useful function. Although amplifiers are available in many diverse types and varieties, the composite amplifier which can be assembled from the discrete modules of this invention finds particular utility as a power amplifier.

Power amplifiers are electronic amplifiers, usually multistage devices, wherein the primary concern of the designer is necessarily directed toward the output stage or stages wherein the power handling capability of the amplifier resides. The output level at which this concern begins to manifest itself is generally accepted to about 10 watts or more, a rate of energy output at which electricity begins to be able to do work on a human scale such as ring a doorbell or power a loud speaker, although this level may vary somewhat according to the amplifier design and application. Above an output of about 10 watts, the problems which must be economically solved in the design of the output stages—heat dissipation, conductor size, overload protection, etc.—economically dominate the design of the entire amplifier. Therefore, as higher power levels are sought, the cost of producing the output stage or stages becomes the major part of the cost of producing the entire amplifier.

In amplifiers having output capabilities below the 10 watts level the cost penalty associated with excess power capability is small enough to allow building amplifiers which can practically be used at several differing power output levels; characteristics associated with the input stages, such as voltage gain and stability, still represent the major portion of the total cost. At levels above 10 watts the economic penalty of excess capability substantially prevents the measure of universality achievable at lower levels.

No single power amplifier design can then hope to be economically acceptable for even a small portion of the varied power amplifier applications since such a design would carry the burden of excessive and economically burdensome capabilities for most applications. Excess capacity and unneeded performance have proven too expensive for widespread acceptance of any standard power device or module, and for this reason, despite the advantages of a standard design, the costly tradition of designing a new power amplifier for each new application has continue.

The power amplifier of the present invention is of a standard universal design which can be used with a wide range of output requirements and yet still has an output capability which precisely suits any given application. This is accomplished by the use of a number of separate and complete amplifier modules which are interconnected to form a composite amplifier having any given output current and power capability. Thus a standard amplifier module can be mass produced in a single or a few configurations with the attendant economic benefits and yet applied to diverse applications having widely differing power requirements.

Furthermore, the amplifier system of the present invention which is made up of a number of distinct modules has further advantages over a conventional power amplifier of unitary construction. For example, an installed amplifier system can be simply expanded to meet changed output requirements merely by additional modules as required instead of replacing the entire system. This allows the composite amplifier to meet the output requirements precisely at a given time without allowing for future increases in output requirements.

In the specific embodiment of the invention described below, the system is made up of two different and distinct types of modules hereafter referred to as a Driver Module and a Booster Module. Together, they represent the basic building blocks with which an amplifier of virtually indefinitely high output current capability may be constructed.

In this two module type system, all of the composite amplifiers begin with a single Driver Module connected to the input which can alone function as a complete power amplifier with a modest output capability, for example 10 watts. Output capability is increased above this level by adding one or more Booster Modules to the Driver Module. These Booster Modules can be simply added to the Driver Module in parallel with one another to increase output power capability up to a value limited by available drive current. Beyond this, further expansion takes place by interposing a Booster Module or Modules, as an intermediate tier, in cascade between the Driver Module and a parallel string of Booster Modules. This expansion pattern of a single Driver Module and cascaded tiers of Booster Modules can be continued virtually indefinitely, limited only by practical considerations such as interconnecting conductor size, power supply voltages, etc.

The specific module circuitry described below also has a number of advantages. For example, each Booster Module employs a feedback circuit to sense internal current flow, so as additional modules are added in parallel, the feedback circuits force equal distribution of load current through all modules, thereby preventing current "hogging" by an individual module. In addition, this feedback sensing may be made a function of module temperature, decreasing current flow in any abnormally warm unit, thereby reducing internal dissipation and cooling an overheated unit. Also, the feedback may be proportioned according to device capability, allowing Booster Modules of different current or dissipation maximums to be intermixed.

In the event of catastrophic component failure within a Booster Module, provisions can be incorporated into each Booster Module for effectively disconnecting the Booster Module from the composite amplifier. The remainder of the composite amplifier can then continue functioning, redistributing the load current amongst the remaining Modules up to their individual capabilities. This redundant operating feature greatly decreases the probability of total amplifier failure.

Also, each Module can be individually packaged and mounted in a fashion which best protects it from harsh environments or other misapplications or mistreatment. Mounting and heat sinking can then be precisely tailored to the specific requirements of each individual Module.

Other objects and purposes will become clear after reading the following detailed description of the drawings.

DETAILED DESCRIPTION OF THE DRAWING

Figure 1:
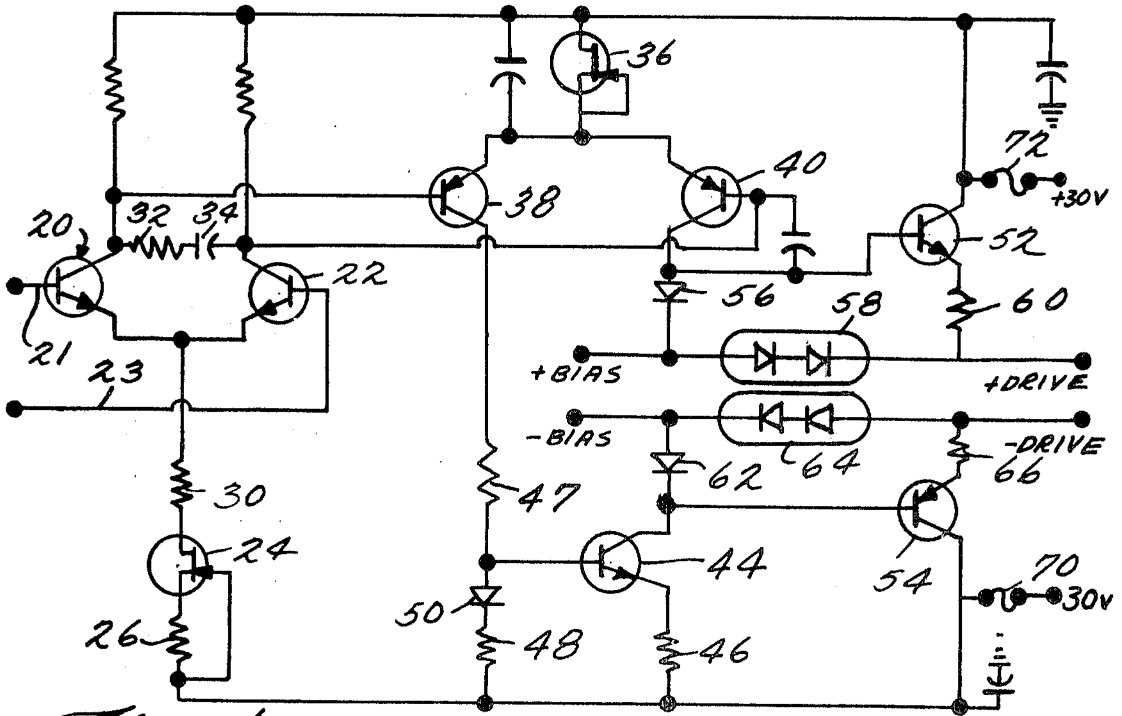
FIG. 1 shows a Driver Module circuit.
Figure 2:
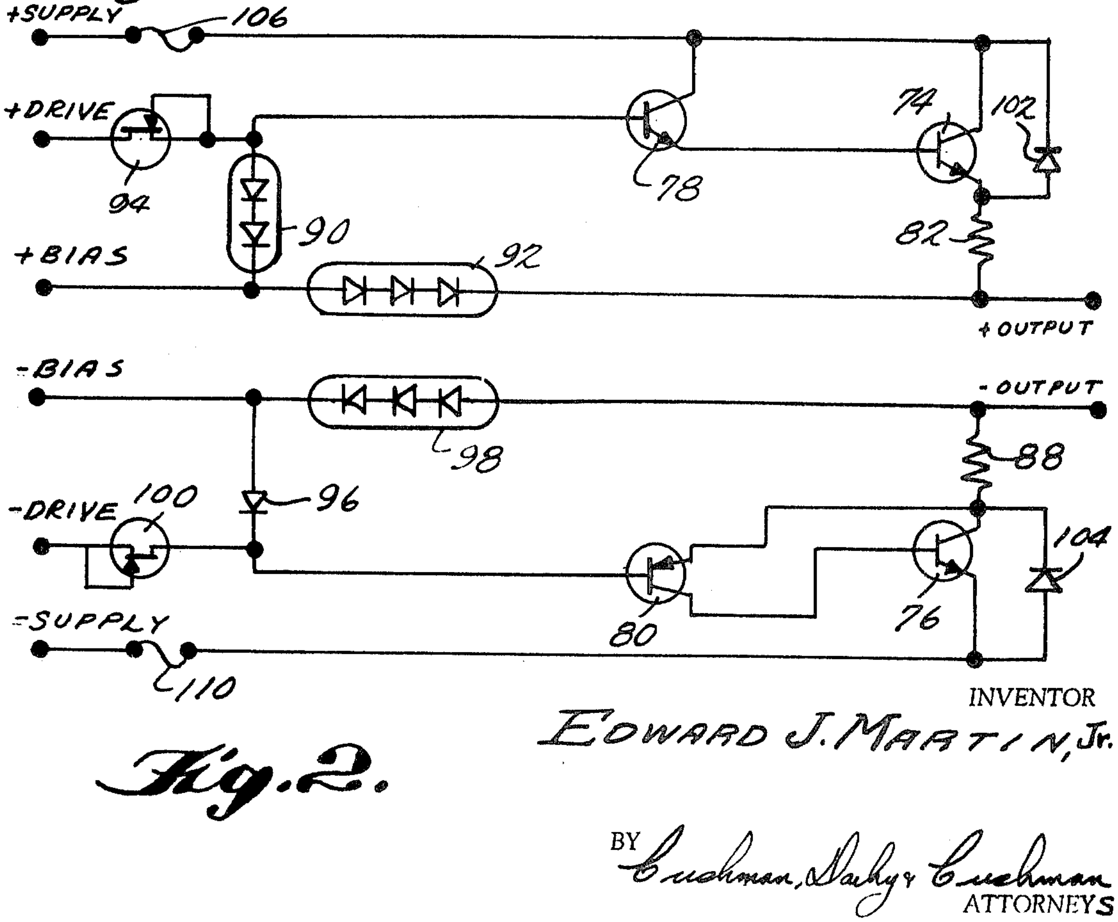
FIG. 2 shows a Booster Module circuit.

Reference is now made to FIGS. 1 and 2 which disclose a Driver and Booster Module circuit making up distinct modules which can be interconnected to form a composite amplifier. The particular composite amplifier which can be formed from the modules shown in FIGS. 1 and 2 has a high gain, low input drift and bipolar output and is commonly known as an operational amplifier, and as such can be used with various feedback elements to duplicate almost any circuit function.

The circuits shown in FIGS. 1 and 2 are basically similar to other conventional solid state operational amplifiers with a number of advantages over such conventional systems. A typical conventional operational amplifier begins with a differential input stage, followed by one or more intermediate stages of direct coupled voltage or current amplification, and ends in a complementary transistor single-ended output stage or stages operated Class B or Class AB. In the embodiment shown in FIGS. 1 and 2, a differential input stage and an intermediate stage are incorporated in the Driver Module and the output stage or stages into Booster Modules. High output current or dissipation capability in this embodiment is obtained by using power transistors in parallel and, if desirable, Darlington connection on, PNP-NPN pairs or a hybrid of these two arrangements for added current gain.

As a power amplifier the operational amplifier made from the two modules furnishes a number of capabilities not possible with ordinary amplifiers. First, the relationship which output voltage, current, frequency, etc. bears to the input signal can be precisely established and maintained by means of an external feedback loop which spans the entire system from input to output. Furthermore, the output is direct coupled and bipolar so that the system can come to rest at some nonzero position. For these reasons and others, the preferred embodiment of this invention sets forth an operational amplifier system but no limitation to any particular type of amplifier is intended nor required.

Several important features distinguish the expandable modular system of the present invention from other amplifiers and, more particularly from other operational amplifiers. First, as described below, the input gain stages are physically separated from the output power stages, each being packaged into the Driver and Booster Modules respectively. This discrete packaging allows the user flexibility in selecting output power capability, mounting, heat sinking, etc., as well as providing an amplifier system which can be quickly and easily expanded.

Also, the complimentary transistor output stage of the Booster Module is split, along the line of symmetry, into two electrically isolated halves, the normal interconnecting points being available external to the Module. This arrangement permits the output halves to be directly jumped together for a common terminal single-ended output, or separated to interpose an indefinite number of circuit tiers in cascade between the Driver Module and output terminal.

Also, to accommodate multitier operation, overcurrent limiting and transient voltage protection, biasing voltage generation and current balancing feedback can be accomplished independently by each output half of each Booster Module. In particular, the use of an emitter resistance in the Booster Module circuit for current balancing also facilitates overcurrent limiting, crossover biasing, and temperature stabilization.

Each output half of the Booster Module is so fused and otherwise protected that, in the event of a catastrophic failure of an output transistor in one Booster Module, that Booster Module disconnects itself from the power supply bus and provides a sufficiently high input impedance load on the drive bus so that undamaged units of a multimodule system can continue functioning.

Complimentary output halves of the Booster Module can also share a common thermal environment and means of heat dissipation to an external sink. Since the Booster Module circuit shown in FIG. 2 operates Class B or Class AB the total circuit dissipation of a given Booster Module cannot exceed that possible by either half and thus sufficient heat sink capacity for either half is also sufficient for the total circuit of the Booster Module. Potting of the entire circuit of the Booster Module in a high thermal conducting medium, such as alumina loaded epoxy, places elements of both halves in the same thermal environment, promoting symmetrical changes in temperature sensitive parameters.

The Driver Module circuit shown in FIG. 1 will now be discussed in detail. In contrast to the Booster Module which provides power capability, the Driver Module accomplishes the function of voltage gain at lower power signal levels. The input section begins with a differential amplifier stage composed of transistors 20, 22 and 24. Field Effect transistor 24, in conjunction with resistor 26, forms a constant current source, presenting a high impedance to the differential pair of transistors 20 and 22 which receive the differential input signals on lines 21 and 23, and thereby allow both high gain and a wide common mode input rejection. Resistance 30 serves to lessen dissipation in transistor 24, while resistor 32 and capacitor 34 serve to tailor the frequency response of the input stage gain.

The output of the differential pair of transistors 20 and 22 appears at their respective collectors and passes directly to a second voltage amplification stage which also functions as a high impedance level inverter or current switchyard as follows. Transistor 36 of this second stage supplies a constant current to the differential pair of transistors 38 and 40. With equal base voltages, this current is divided equally between the two collector loads of transistors 38 and 40. The collector current of transistor 38 is effectively inverted by the circuit composed of transistor 44, resistors 46, 47 and 48 and diode 50. Thus, at balance, the collector of transistor 40 presents a source of current equal to the current demand of transistors 44's collector. Unbalancing the differential pair unbalances the supply and demand of the current source which is transistor 40 and the current sink which is transistor 44.

If transistor 40 conducts more heavily, the net excess of current will begin to flow out through the base of transistor 52 allowing the output to swing positive, while transistor 54 is back biased to cutoff. If on the other hand transistor 38 conducts more heavily, the net deficiency in current will begin to cause flow in from the base of transistor 54. The output then swings negative, while transistor 52 is back biased to cutoff. This "-current switchyard" thus permits control of the output voltage from balanced high impedance "current sources." In turn, this permits interposing various constant voltage sources between the Plus and Minus Bias terminals as necessary to tailor crossover biasing when more than one output tier is used.

Diode 56 and diode string 58 and emitter resistor 60 serve to produce a crossover bias as well as to limit the maximum current through transistor 52, as do diode 62 and diode string 64 and resistor 66 for transistor 54. The operation of these elements is similar to that of the diodes used to produce crossover bias in the Booster circuit as discussed in detail below. Fuses 70 and 72 clear the power supply buses of plus and minus 30 volts in case of an internal short or other fault within the Driver Module.

The operation of the Booster Module shown in FIG. 2 will now be discussed in detail. This Booster Module is intended for use as either a final output stage, or as in intermediate current amplifier stage between the Driver and many Booster Modules connected in parallel, and is a Class AB amplifier, split into two complimentary halves employing Darlington connected transistors or NPN-PNP pairs for current gain and sharing a common thermal environment. In the embodiment shown in FIG. 2, a hybrid system with a Darlington connected pair of transistors in the top half and a PNP-NPN pair in the bottom is used. Such a hybrid system has the advantage that both of the main losser transistors can be of the NPN type. Since it is frequently more economical to utilize NPN silicon transistors than PNP transistors and since NPN transistors are available in higher power rating than similar PNP devices, this hybrid arrangement represents a desirable arrangement. However, Darlington connected transistors of NPN-PNP pairs on both halves can also be used and under certain circumstances might be more suitable. When the Booster Module is to be used as a final stage, the Plus and Minus Bias terminals are electrically strapped together and the Plus and Minus output terminals are connected together as a single ended output bus.

Circuit operation for the Booster Module will be described by function, since several components perform interrelated tasks. The main losser transistors are transistors 74 and 76 and their maximum current and dissipation rating largely determine the power capability of each individual Booster Module. In order to lessen input drive current requirements, transistors 78 and 80 which serve as current amplifiers are added to transistors 74 and 76 in Darlington fashion in the top and positive half and as a PNP-NPN pair in the bottom and negative half.

When more than one Booster Module is connected in parallel to increased current or power capability, "current hogging" or unequal current distribution, which results due to differences in individual transistor gain characteristics, is prevented by the use of emitter resistors in each Module, for example resistor 82 in the positive half and resistor 88 in the negative half. These resistors provide negative feedback action thereby making the transconductance of the circuit more nearly a function of the resistor than the transistor's base to emitter characteristics. Furthermore, these emitter resistances may be chosen with a strong positive temperature coefficient, so that the current share through an abnormally hot Module, is automatically decreased thereby also regulating transistor dissipation as a function of heat sink temperature.

Feedback action from the emitter resistors is also used to effect limiting of the maximum output current. Because of these resistances, output current will be nearly a linear function of base drive voltage, higher currents requiring higher voltages. The base to output voltage excursion of the positive half is then ultimately clamped when the diode strings 90 and 92 become forward biased. This constitutes the maximum current limit, additional drive potential being absorbed by transistor 94. A similar situation exists for the negative half of the Module with diode strings 96 and 98 and transistor 100.

The limiting value of current is then sized in accord with the maximum allowable supply voltage to limit total dissipation to within the transistors capability in case of a dead short of the output to ground. By proper proportioning of emitter resistance values, it is possible to mix Booster Modules of varying dissipation capabilities in parallel operation.

Output distortion occurring as the load current conduction shifts from one half of the circuit to the other is minimized in this embodiment by biasing the Booster Module into Class AB operation, i.e., crossover is not abrupt at zero output voltage, but rather there is some residual current flow through both halves at this point. The necessary bias potential for this situation is created by the forward voltage drops across diodes 90 and 96. These diodes 90 and 96 have temperature coefficients similar to the transistors 74, 76, 78 and 80's base-to-emitter junction. By potting the diodes in close proximity to the transistors, they share the same thermal environment, thus allowing the bias voltage to "track" transistor characteristics over wide temperature ranges. The emitter resistance 82 and 88 also function in the crossover biasing. For instance, as transistor 76 begins to conduct and the output is drawn negative, the potential building up across resistor 88 serves to back bias transistor 74. Resistor 84 then cuts off transistor 78. Thus, once well pass the crossover point, the idle side is cut off completely.

Each Module of the system, both Driver and Booster then generates its own biasing conditions necessary for Class AB operation. The inclusion of individual biasing elements and close thermal coupling with their respective transistors insures all elements of the system remain properly biased in spite of temperature differences between individual Modules.

The drive input voltage in this embodiment is from a low impedance, or "stiff" source. It is therefore useful to introduce some compliance in order for the biasing and current limiting features to operate properly. This input resistance also aids current balancing amongst parallel connected modules and is provided by Field Effect transistors 94 and 100.

With the gate tied to the drain, transistors 94 and 100 provide an almost linear resistance function at low currents, but abruptly switch into a constant current mode upon reaching an intrinsic "pinch off" current level. Thus, transistors 94 and 100 provide nearly linear resistance compliance for operation of the biasing diodes, but limit input current when further input-to-output voltage excursions are prevented by the current limiting circuit.

Diodes 102 and 104 limit transient voltage spikes, which may occur while rapidly switching inductive loads, by clamping them within the limits of the plus and minus supply voltages. Each Booster Module is then individually protected against transients so that the entire composite amplifier regardless of the number of Modules it incorporates is similarly protected.

In the event of catastrophic failure of the losser transistors 74 and 76, particularly a collector-to-emitter short, the collector fuse 106 on the positive half and fuse 110 in the negative will open as the amplifier system's closed-loop action attempts to pull the output back to normal. The inactivated half then rides at about output potential with the transistors 94 and 100 preventing loading of the drive bus, while the other half continues to operate normally. Therefore each module of the system is individually protected against faults. An expanded system built from these modules then is not only similarly protected but a failure of one module will not ordinarily cause the rest of the modules to fail. The risk of total system failure is therefore substantially reduced.

Figure 3:
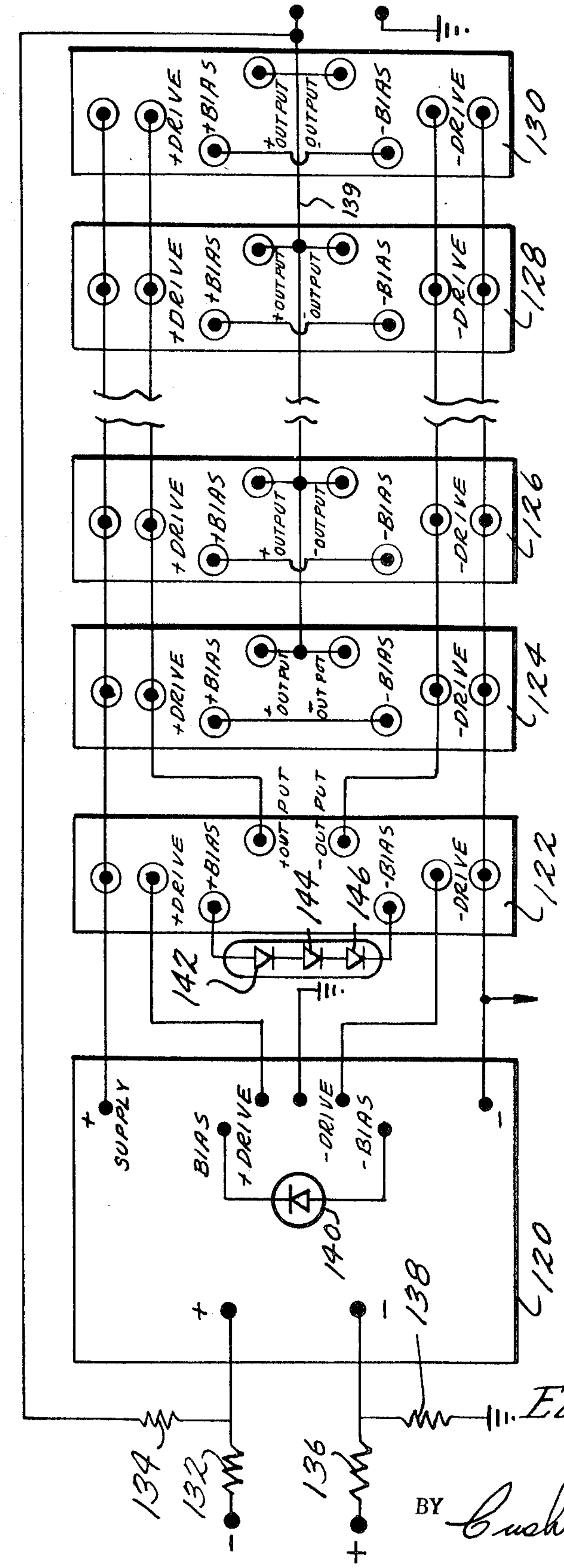
FIG. 3 shows a composite amplifier with a Driver Module and a number of Booster Modules.

FIG. 3 is an illustration showing the interconnection of a Driver Module 120 and numerous Booster Modules such as Booster Modules 122, 124, 126, 128 and 130 in a composite amplifier. Such an amplifier can, for example, provide a differential gain of about 10 and a maximum output capability of plus 20 volts at 500 amperes, or 10,000 watts. This particular output would then require about 200 fifty watt Booster Modules connected in parallel and a maximum drive current of about 2 amperes. Since this is beyond the output capability of the particular Drive Module shown in FIG. 1, an intermediate Booster Module 122 is interposed and the other Booster Modules connected in parallel with each other and in series with Booster Module 122.

For the system shown in FIG. 3 regardless of the number of modules, the overall functional configuration of the composite amplifier remains that of an operational amplifier, combining differential input, single-ended output and symmetrical bipolar operation. Only the output current capability of the composite amplifier changes with the number of modules. Such a composite amplifier may be then combined with external feedback to produce any desired transfer function which will then be bipolar and symmetrical. In FIG. 3, feedback resistors 132, 134, 136 and 138 operate as conventional feedback elements for an operational amplifier arrangement.

Proper crossover biasing for Driver Module 120 and Booster Module 122 which serves as an intermediate amplifier is achieved when the Plus and Minus Bias terminals are separated by a fixed potential which establishes the desired quiescent currents through the biasing diodes and provides sufficient compliance for their thermal tracking. The Bias terminals of Booster Modules 124, 126, 128 and 130 are jumped together as are the output terminals to provide a single output line designated 139. This fixed potential is established by inserting a constant voltage element, such as a string of forward biased diodes, or a Zener diode, between the Plus and Minus Bias terminals. Diode 140 provides a fixed potential for the Driver Module 120 and diodes 142, 144 and 146 for the Booster Module 122 which in effect is an intermediate amplifier.

Figure 4:
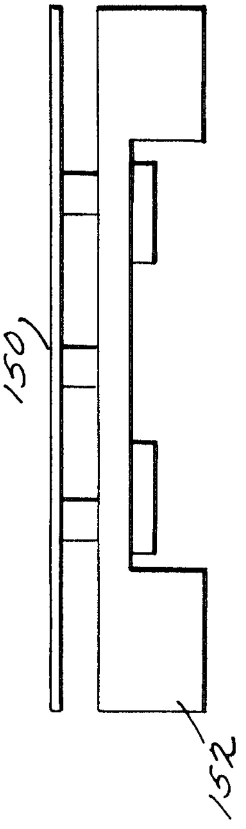
FIG. 4 shows a Module on a typical mounting.

Reference is now made to FIG. 4 which shows a Module 150 on a typical mounting 152. The Modules can be packaged in any way which facilitates system construction. The Driver Module, ordinarily being small and self cooled, can ordinarily be mounted directly on a printed circuit board along with the other elements making up the feedback loop. The Booster Modules however are ordinarily mounted on heat sinks and potted in high thermal conductive epoxy for maximum cooling. A variety of components such as thick or thin films, monolytic integrated circuits, hybrids, and others can be utilized to construct the various modules.

The specific embodiment disclosed above represents only one example of the invention and many other changes and modifications are possible without departing from the spirit of the invention. Accordingly, the invention is intended to be limited only by the scope of the appended claims.

I claim:

1. A flexible amplification system for forming a composite operational amplifier having a power output of 10 watts or greater for use with a given one of any number of devices having differing power requirements comprising:

- a driver amplifier module having means for receiving input signals and producing output signals amplified in voltage and inverted with respect to the input signals, and means electrically connected to said receiving and producing means for receiving said output signals and producing first and second output signals which are separated by a fixed potential and which track together and having a power capability less than the power requirement of any of said devices,
- a driver mounting for mounting said driver module,
- a plurality of booster modules each connected to said driver module for receiving said first and second output signals so that the composite amplifier comprised of said driver module and said plurality of booster modules has the approximate power requirement of said given one of said devices,
- each said booster module being a Class AB, noninverting amplifier with a positive section for receiving one of said first and second output signals from said driver module and a negative section for receiving the other of said first and second signals from said driver module, each said section including at least a single current amplification stage for amplifying a received signal having at least a single transistor, an emitter feedback resistance connected to said transistor so that said emitter resistance causes equal sharing of the output load current of said driver module among all of said number of connected booster modules and limits the ultimate current through said transistor, and crossover biasing means thermally connected to said transistor so as to bias said transistor, and
- a plurality of booster mounting, being separate from all other mountings and being adapted to mount an individual booster module so as to satisfy the heat dissipation requirements of that booster module and so that the positive and negative sections of said Class AB amplifier share the same thermal environment and the same path of heat dissipation.

2. A system as in claim 1 wherein each said booster module is connected in parallel with each other booster module and in series with said driver module.

3. A system as in claim 1 wherein a first booster module is connected in series with said driver module to serve as an intermediate amplifier and each of the remainder of said booster modules is connected in parallel with each of the other booster modules of said remainder and in series with said first booster module.

4. A circuit as in claim 1 wherein said biasing means includes a plurality of diodes mounted in the same thermal environment as said transistor so that said diodes thermally track said transistor.

5. A circuit as in claim 1 wherein each said section includes a field effect transistor connected to said transistor of that section for transmitting the output signal received by that section to said transistor of that section and having its gate connected to its drain so that it provides nearly linear resistance compliance at the current levels at which said Class AB amplifier normally operates and a substantially constant current mode above an intrinsic current level.

6. A Class AB noninverting amplifier circuit having positive and negative sections, each section comprising:

- a drive line for receiving the input signal of that section,
- resistive means connected at one end to said drive line for protecting that section against excessive currents on said drive line,
- a bias line for providing a bias voltage,
- at least a single diode connecting said bias line to the end of said resistive means not connected to said drive line for providing a bias potential during cross over,
- at least a single diode connecting said bias line to the output of said amplifier for, together with the other diode, limiting the maximum current output of said amplifier,
- a supply line for providing a supply voltage,
- a pair of darlington connected transistors, each having base, collector and emitter terminals, the base terminal of one of said transistors being connected to the end of said resistive means not connected to said drive line for receiving an input signal on said drive line via said resistive means, one of the other terminals being connected to said supply line and the second of the other terminals being connected to the base terminal of the second transistor, one of the other terminals of the second transistor being connected to said supply line, and
- a resistor connecting the second terminal of the other terminals of said second transistor to said output.

7. An amplifier circuit as in claim 6 wherein said resistive means is a field effect transistor with its gate connected to its drain so that it provides a nearly linear resistance compliance at low currents and a substantially constant current mode above an intrinsic current level.

8. An amplifier as in claim 6 wherein said transistors and diodes are mounted in the same thermal environment so that said diodes thermally track said transistors.

9. An amplifier as in claim 8 including common mounting means for both sections of said circuit so that both sections share the same thermal environment and the same path of heat dissipation.

10. An amplifier as in claim 6 wherein each said section further includes fuse means in said supply line.